United States Patent
Yoneda et al.

(10) Patent No.: US 8,474,134 B2
(45) Date of Patent: Jul. 2, 2013

(54) FUNCTIONAL ELEMENT-MOUNTED MODULE AND A METHOD FOR PRODUCING THE SAME

(75) Inventors: Yoshihiro Yoneda, Hakusan (JP); Takahiro Asada, Kanazawa (JP); Kazuaki Suzuki, Kanuma (JP)

(73) Assignee: Dexerials Corporation, Tokyo (JP)

( * ) Notice: Subject to any disclaimer, the term of this patent is extended or adjusted under 35 U.S.C. 154(b) by 145 days.

(21) Appl. No.: 12/659,740

(22) Filed: Mar. 19, 2010

(65) Prior Publication Data
US 2010/0175247 A1 Jul. 15, 2010

Related U.S. Application Data

(60) Division of application No. 12/230,602, filed on Sep. 2, 2008, now Pat. No. 7,812,264, which is a continuation of application No. PCT/JP2007/053903, filed on Mar. 2, 2007.

(30) Foreign Application Priority Data

Mar. 2, 2006 (JP) ................................. 2006-056141

(51) Int. Cl.
*H05K 3/30* (2006.01)
(52) U.S. Cl.
USPC .................. 29/841; 29/595; 29/832; 257/704
(58) Field of Classification Search
USPC ..................... 29/841, 595, 832; 257/704, 666, 257/678, 680; 174/252, 521–523, 527, 538; 156/245, 246
See application file for complete search history.

(56) References Cited

U.S. PATENT DOCUMENTS

| | | | |
|---|---|---|---|
| 5,037,779 A * | 8/1991 | Whalley et al. | ............... 257/687 |
| 5,543,364 A | 8/1996 | Stupian et al. | |
| 5,962,810 A | 10/1999 | Glenn | |
| 5,982,621 A * | 11/1999 | Li | ................................. 361/704 |
| 6,239,486 B1 | 5/2001 | Shimizu et al. | |
| 6,767,753 B2 * | 7/2004 | Huang | ............................. 438/25 |
| 2002/0047190 A1 * | 4/2002 | Miyamoto | ..................... 257/666 |

(Continued)

FOREIGN PATENT DOCUMENTS

| | | |
|---|---|---|
| JP | A-46-5177 | 11/1971 |
| JP | A-61-32535 | 2/1986 |

(Continued)

*Primary Examiner* — Peter DungBa Vo
*Assistant Examiner* — Jeffrey T Carley
(74) *Attorney, Agent, or Firm* — Oliff & Berridge, PLC

(57) ABSTRACT

A functional element-mounted module can be decreased in size and requires no costly and special members for a light transition member. A substrate is used, on which an optical functional element having an optical function part and bonding pads therearound is mounted by wire bonding, with an upper face of the element upward. A bank to dam a liquid sealing resin is provided around the optical functional element on the substrate, and the liquid sealing resin is dropped and filled between the optical functional element and the bank such that the bonding pads and partial gold wires for the wire bonding are exposed. A package-component member having a hole corresponding to the optical functional element is abutted to the bank such that the hole is opposed to the function part of the functional element. Thereby, the package-component member is contacted to the liquid sealing resin. The package-component member is fixed to the substrate by curing the liquid sealing resin, and the bank is cut away.

3 Claims, 5 Drawing Sheets

U.S. PATENT DOCUMENTS

| | | | |
|---|---|---|---|
| 2004/0089898 A1 | 5/2004 | Ruhnau et al. | |
| 2006/0055056 A1* | 3/2006 | Miura et al. | 257/779 |
| 2006/0192281 A1* | 8/2006 | Lu et al. | 257/704 |
| 2007/0096280 A1 | 5/2007 | Tu et al. | |

FOREIGN PATENT DOCUMENTS

| | | | |
|---|---|---|---|
| JP | A-63-73281 | | 4/1988 |
| JP | A-3-225867 | | 10/1991 |
| JP | A-5-335534 | | 12/1993 |
| JP | A-11-214754 | | 8/1999 |
| JP | A-2000-58805 | | 2/2000 |
| JP | A-2001-250889 | | 9/2001 |
| JP | A-2001-516956 | | 10/2001 |
| JP | A-2003-68939 | | 3/2003 |
| JP | 2004-0400099 | * | 2/2004 |
| JP | A-2004-40099 | | 2/2004 |

* cited by examiner

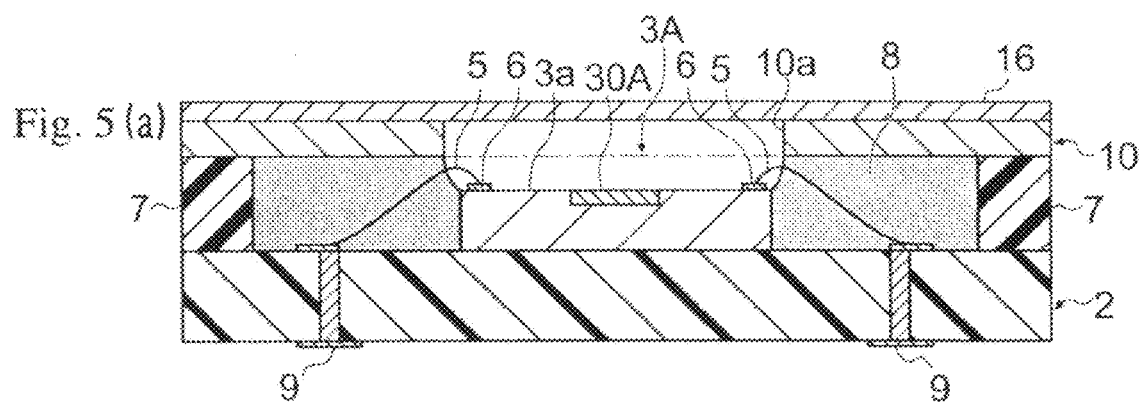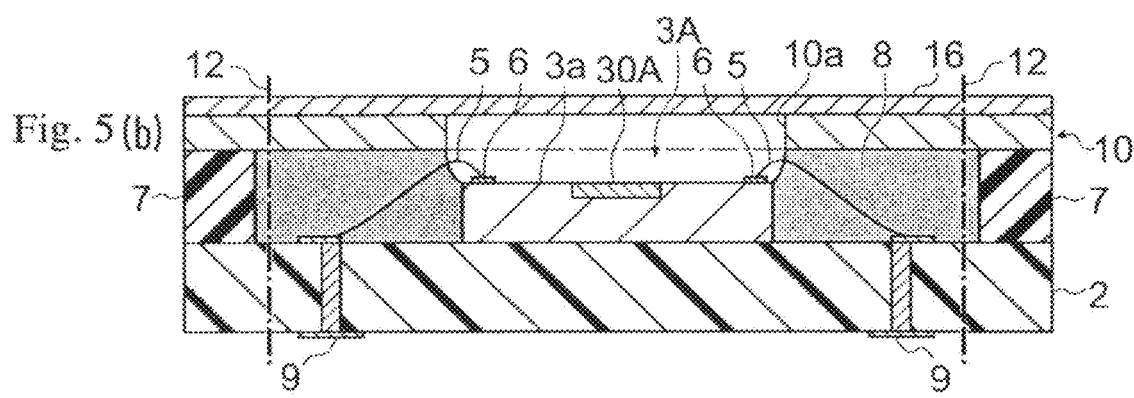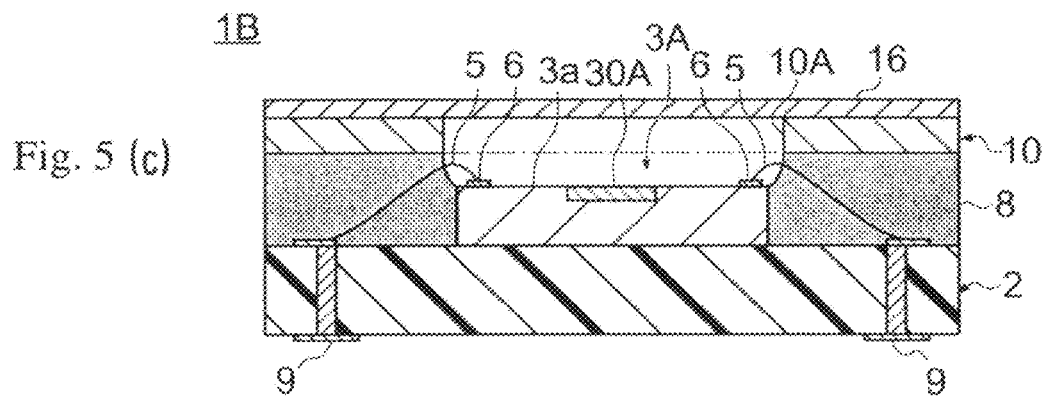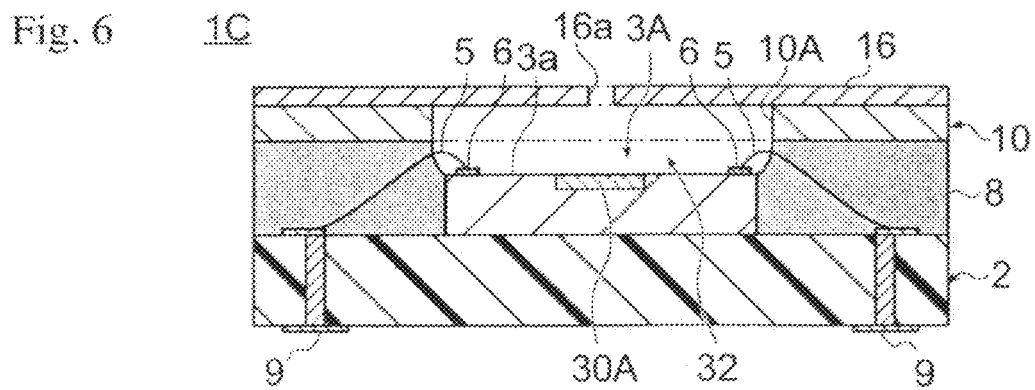

CONVENTIONAL ART

FUNCTIONAL ELEMENT-MOUNTED MODULE AND A METHOD FOR PRODUCING THE SAME

This is a Divisional of Ser. No. 12/230,602 filed on Sep. 2, 2008, which in turn is a Continuation of International Application No. PCT/JP2007/53903 filed on Mar. 2, 2007, which claims priority of Japan Patent Document No. 2006-056141 filed on Mar. 2, 2006. The entire disclosure of the prior application is incorporated by reference herein in its entirety.

BACKGROUND

Aspects of the present disclosure relate to a functional element-mounted module in which a functional element such as a light-receiving element or a light-emitting element is used, and the functional element is mounted on a substrate using a sealing resin.

Modules having a hollow-structure package are widely used as functional element-mounted module of this type, as is conventionally known in the art.

FIG. 8 shows a conventional optical functional element-mounted module 100 known in the art, having a package 101 constructed by attaching a light transmission member 104 onto a substrate 102 via a frame-shaped spacer 103. An optical functional element 105 is disposed inside the package 101 with an optical function part 106 being opposed to the light transmission member 104 so that optical signals 107 are transmitted or received, as indicated by the arrows shown in FIG. 8.

Conventionally in the art, the frame-shaped spacer 103 is a fundamental and necessary element for holding the light transmission member 104. As a result, the conventional module is limited in its ability to be reduced in size, and thus a major issue is to provide a functional element-mounted module that is capable of size variations.

In addition, in order to transmit blue-violet laser beams of a short wavelength at, for example, 405 nm, a glass having a special coating must be used as the light transmission member 104, which presents a problem of very high cost and expense for production.

Thus for a package constructed by attaching a light transmission member to a substrate using a sealant instead of the frame-shaped spacer has been proposed (see, e.g., JPA3-225867) in the art.

The present disclosure was proposed to solve existing problems in the art related to the conventional techniques of providing a functional element-mounted module, and is aimed at providing a functional element-mounted module capable of being decreased in size, and one that does not require costly and special members, and to provide a method for producing the same.

SUMMARY

A functional element-mounted module can be produced in a method according to one aspect of the present disclosure, the method including the steps of providing a functional element having a given function part and bonding pads therearound, using a substrate on which the functional element is mounted by wire bonding on a function part-side face of the element body, with the function part-side face upward, providing a bank on the substrate near the functional element to dam up a liquid sealing resin, dropping the liquid sealing resin between the functional element and the bank, filling the liquid sealing resin between the functional element and the bank such that the bonding pads and partial wires for the wire bonding are exposed, abutting a package-component member having a hole corresponding to the functional element to the bank such that the hole is opposite to the function part of the functional element, thereby bringing the package-component member into contact with the liquid sealing resin, fixing the package-component member onto the substrate by curing the liquid sealing resin, and cutting away the bank.

According to one aspect of the present disclosure, the hole of the package-component member is formed of nearly the same size as the functional element.

According to one aspect of the present disclosure, the bonding pad of the functional element is provided with a metallic film which enables wire bonding with gold wires and protects an Al-based electrode.

In addition, another aspect of the present disclosure provides a method for producing a functional element-mounted module further including a functional element-mounted module a step of providing a protecting cover member on the package-component member to cover the hole.

According to one aspect of the present disclosure, the protecting cover member is a protecting film that is peelable from the package-component member.

Another aspect of the present disclosure provides a functional element-mounted module having a substrate and a package-component member, the substrate having a functional element mounted thereon by wire bonding with a function part-side face of the element body facing upward, the functional element having a predetermined function part and bonding pads therearound on the function part-side, and the package-component member having a hole corresponding to the functional element, wherein the functional element is sealed with a sealing resin and the package-component member is fixed onto the substrate with the sealing resin, while the bonding pads of the functional element and partial wires for the wire bonding are exposed.

According to one aspect of the present disclosure, a protecting cover member is provided on the package-component member for covering the hole, and a gas exhaust member is provided in the protecting cover member for communicating with a space above the function part of the functional element. In another embodiment of the present disclosure, the protecting cover member is provided on the package-component member to cover the hole, and the gas exhaust member is provided between the package-component member and the protecting cover member to communicate with a space above the function part of the functional element.

Exemplary embodiments of the present disclosure also provide a protecting cover member provided on the package-component member to cover the hole, wherein the protecting cover member is a protecting film peelable from the package-component member.

According to one aspect of the present disclosure, since the package-component member is fixed by dropping and curing the liquid sealing resin between the functional element and the bank, the frame-shaped spacer as used in the conventional technique in the art is unnecessary, such that a significantly downsized functional element-mounted module can be provided.

Further, according to one aspect of the present disclosure, since a module with the function part of the functional element exposed is provided, a short wavelength light such as blue-violet laser beams, for example, can be inputted and outputted without attenuation of the light and without requiring an expensive glass having a special coating. Furthermore, exemplary embodiments of the present disclosure also provide a functional element-mounted module having excellent heat emission performance.

Moreover, according to one aspect of the present disclosure, the sealing resin is filled and cured between the functional element and the bank such that the bonding pads on the functional element-side face and partial wires for the wire bonding are exposed. Even if the downsizing of the functional element results in making the distance between the bonding pads and the function part shorter, exposure of the function part positioned inside the bonding pads on the function part-side face is not affected. As a result, exemplary embodiments of the present disclosure provide a functional element-mounted module that can be further decreased in size.

In another aspect of the present disclosure, when the hole of the package-component member is formed to be nearly an identical size as the functional element, at least the bonding pads on the functional element-side face are still exposed due to surface tension of the sealing resin located between the functional element and the bank.

Another aspect of the present disclosure provides that when the metallic film, which enables the wire bonding with gold wires and protects the Al-based electrode, is formed on the bonding pads of the functional element, the corrodible bonding pads are protected such that the corrosion resistance of the bonding pads can be improved without lowering bonding strength of the wire bonding.

According to the present disclosure, foreign matters can be prevented from attaching to the function part of the functional element by providing the protecting cover member on the package-component member to cover the hole. As a result, exemplary embodiments of the present disclosure provide a hollow-structure package to be obtained.

Further, when the gas exhaust member is provided in the protecting cover member or between the package-component member and the protecting cover member to communicate with the space above the function part of the functional element, the package can be prevented from being broken by an expansion of a gas or moisture in hollow portions during reflowing when mounting the package.

In another aspect of the present disclosure, the protecting film peelable from the package-component member is used as the protecting cover member, optical signals can be inputted and outputted in use of, for example, an optical functional element without attenuation, by peeling the protecting member in use (at the time of assembling the module to a device).

Therefore, the functional element-mounted module of the present disclosure is capable of being decreased in size and requires no costly or special members, thus different from and characterized from the conventional modules as known in the art.

BRIEF DESCRIPTION OF THE DRAWINGS

FIGS. 5(a) to (c) are configuration views illustrating a principal portion of a further embodiment according to one aspect of the present disclosure.

FIG. 6 is a sectional configuration view illustrating a variation of the same embodiment in FIGS. 5(a) to (c) according to one aspect of the present disclosure.

DETAILED DESCRIPTION OF EMBODIMENTS

Figure 2:
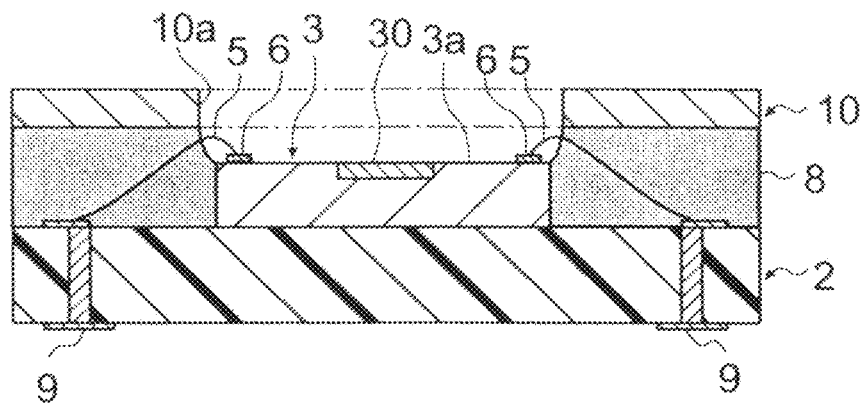
FIG. 2 is a sectional configuration view of a functional element-mounted module according to one aspect of the present disclosure.
Figure 3:
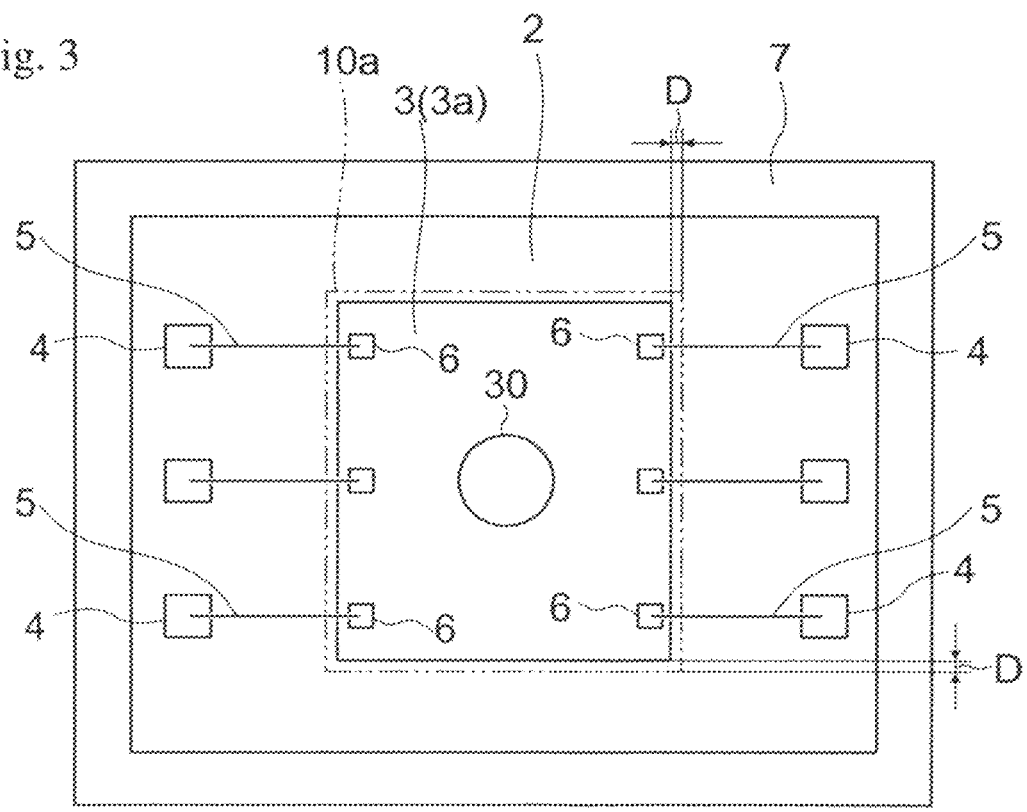
FIG. 3 is a view of the functional element-mounted module prior to sealing.

Hereinafter, exemplary embodiments of the present disclosure will be explained in detail with reference to the drawings. FIGS. 1(a) to (d) are schematic views illustrating a method for producing a functional element-mounted module according to an embodiment of the present disclosure. FIG. 2 is a sectional configuration view of the functional element-mounted module, and FIG. 3 is a plan view showing the functional element-mounted module before sealing.

Figure 1:
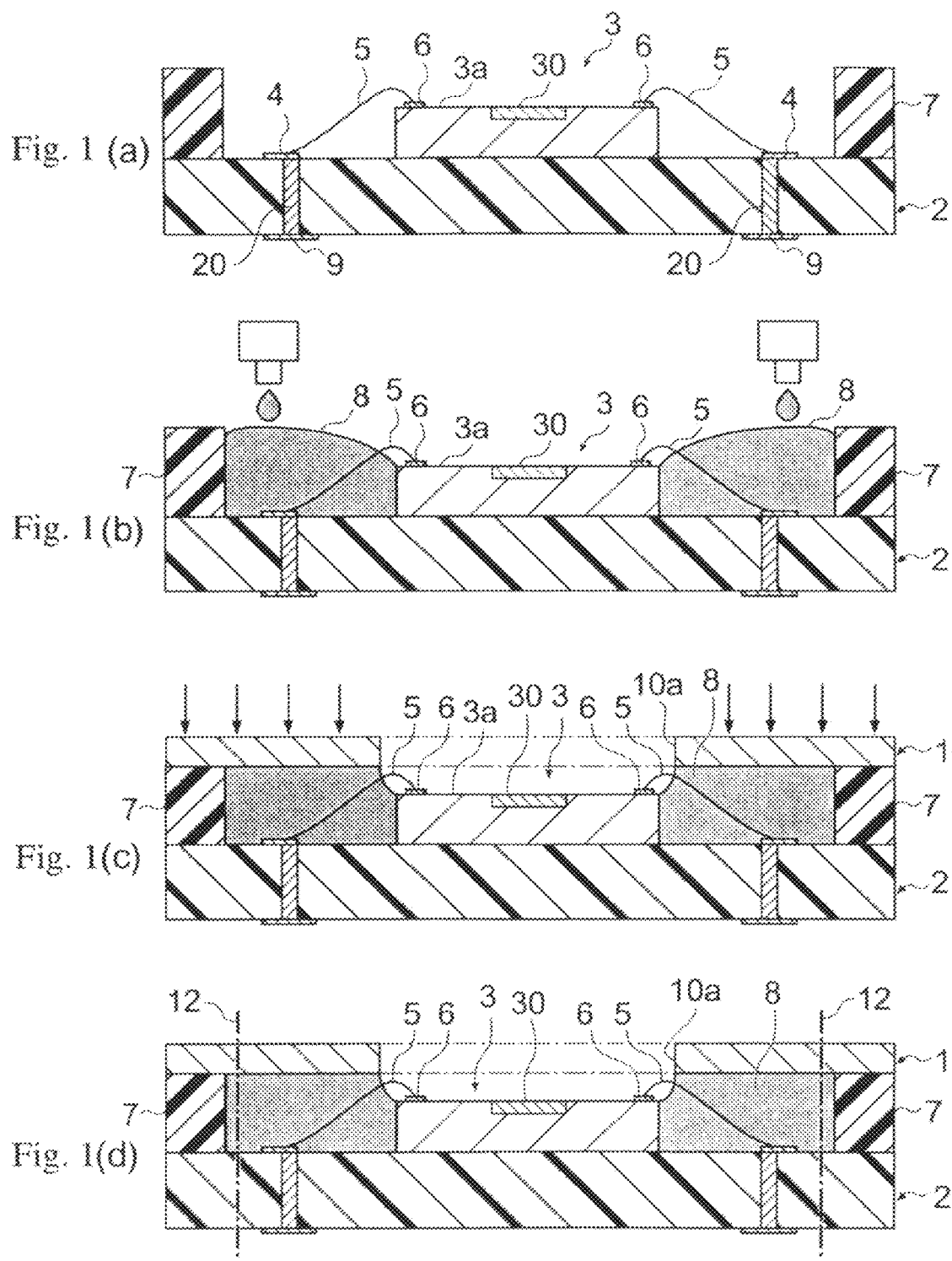
FIGS. 1(a) to (d) are schematic diagrams of embodiments illustrating a method for producing a functional element-mounted module according to one aspect of the present disclosure.

As shown in FIG. 1(a), according to this embodiment, an optical functional element 3 having an optical function part 30, such as a light-receiving element or a light-emitting element, is first mounted onto a substrate 2, with an upper face (an optical function part-side face) 3a on which the optical function part 30 is provided upward.

At this stage, the optical function part 30 of the optical functional element 3 is disposed in a central portion of the upper face 3a of the optical functional element 3. Further, a plurality of bonding pads 6 are provided on the upper face 3a of the optical functional element 3 around the optical function part 30. According to this exemplary embodiment, plurality of bonding pads are provided at opposite edge portions of the optical function part 30.

Although not particularly limited in the present disclosure, a protecting metallic film is preferably provided on the bonding pad 6 for improving corrosion resistance of the bonding pad 6.

For this metallic film, a metallic material which enables wire bonding with gold and protects an Al-based electrode is preferably used to present lowering the bonding strength of the wire bonding with gold. A material, for example, Ni/Au alloy, is preferably employed as such a metal to be used as an under bump metal.

A plurality of patterned connecting portions 4 are provided around the optical functional element 3 on the substrate 2, shown longitudinally in this embodiment on opposite edge portions of the substrate 2, and these connecting portions 4 are electrically connected to the bonding pads 6 of the optical functional element 3 by using gold wire 5.

The connecting portions 4 on the substrate 2 are connected to externally connecting terminals 9 at a back side of the substrate 2 via an electroconductive material 20 filled in through-holes.

A bank 7 to dam a liquid sealing resin 8 is provided in an area around the optical functional element 3 in the substrate wherein the area may be, for example, an edge portion of the substrate 2.

According to one aspect of the present disclosure, although the shape of the bank 7 is not particularly limited, it is preferably in a ring-like shape or rectangular shape, for example, surrounding the optical functional element 3 to effectively dam the sealing resin 8.

Further, the upper end portion of the bank 7 is set preferably higher than the positions of the upper end portions of the gold wires 5 when the -component member 10, though not shown in this figure, is pressed thereto.

In FIG. 1(b), the liquid sealing resin 8 is dropped between the optical functional element 3 and the bank 7, thereby filling the sealing resin 8 between the optical functional element 3 and the bank 7.

In this embodiment, the filled sealing resin 8 preferably takes such a shape to prevent it from reaching the bonding pads 6 of the optical functional element 3, and it is preferred that the top portion of the sealing resin 8 is nearly on the same level as the upper end portion of the bank 7. According to this embodiment, the bonding pads 6 and the partial (the end portions of) gold wires 5 on the side of the bonding pads 6 are exposed.

In the present disclosure, the type of sealing resin 8 is not particularly limited where the sealing resin can either be a thermosetting resin or an UV-curable resin. In particular, an epoxy-based resin is preferably used to ensure the sealing quality. Furthermore, although the viscosity of the sealing resin 8 is not particularly limited, a resin having a viscosity of 5 to 50 Pa·s is preferably used to prevent the sealing resin 8 from flowing onto the upper face 3a of the optical functional element 3.

In addition, as shown in FIG. 1(c), the planar package-component member 10 made of a printed wiring board, a plastic plate or the similar embodiments is disposed in contact with the upper end portion of the bank 7, and completely pressed toward the substrate 2 under a given pressure.

As shown in FIG. 3, a hole 10a is provided in the package-component member 10 in such a manner that it is nearly an identical shape and nearly the same size as, or slightly larger than, the upper face 3a of the optical functional element 3. The package-component member 10 is located and pressed in such a manner that the hole 10a is positioned immediately above the optical functional element 3.

By this step, a lower face of the package-component member 10 on the side of the substrate 2 is made contact with the sealing resin 8, in a manner such that the sealing resin 8 is filled around the optical functional element 3 and between the substrate 2 and the package-component member 10.

As a result of capillary action, the sealing resin 8 that is filled between the optical functional element 3 and the bank 7 spreads toward the upper face 3a of the optical functional element 3 along the lower face of the package-component member 10. However, the sealing resin is blocked at an edge portion of the hole 10a as a result of the surface tension of the resin, in a manner such that the bonding pads 6 and a portion of the gold wires 5 on the side of the bonding pads 6 remain exposed.

In one aspect of the present disclosure, the distance D in FIG. 3 between the peripheral portion of the upper face 3a of the optical functional element 3 and the inner edge portion of the hole 10a is not particularly limited, but it is preferably set at 0 to 1 mm for preventing the sealing resin 8 from flowing onto the upper face 3a of the optical functional element 3.

The distance (clearance) between the upper face 3a of the optical functional element 3 and the lower face of the package-component member 10 is not particularly limited, but is preferably set at 100 to 500 μm from for preventing the sealing resin 8 from flowing onto the upper face 3a of the optical functional element 3.

Moreover, in an embodiment where the thermosetting resin is used as the sealing resin 8, the sealing resin 8 is cured in the above state by heating at a given temperature at this stage, thereby fixing the package-component member 10 onto the substrate 2. Thereafter, as shown in FIG. 1(d), by dicing along scribing lines 12 near the inner side of the bank 7, a target optical functional element-mounted module 1 as shown in FIG. 2 is obtained.

As mentioned above, according to this embodiment, since a frame-shaped spacer as known in the conventional technique is made unnecessary, a functional element-mounted module 1 that decreased in size can be obtained.

In addition, since a module in which the optical function part 30 of the optical functional element 3 is exposed can be obtained according to this embodiment, it is possible to provide a functional element-mounted module 1 having excellent heat emission performance capable of inputting to outputting short wavelength beams such as blue-violet laser beams without requiring a costly glass with a special coating and without attenuating the light.

Further, according to the present embodiment, since the hole 10a of the package-component member 10 is nearly the same size as the optical functional element 3, this allows the sealing resin 8 to be filled and cured between the optical functional element 3 and the bank 7 in such a manner that the bonding pads 6 on the upper face 3a of the optical functional element 3 and the end portions of the gold wires 5 on the side of the bonding pad 6 are exposed. As a result, even if the optical functional element 3 is decreased in size and the distance between the bonding pads 6 and the optical function part 30 becomes smaller, the optical function part 30 positioned inside the bonding pads 6 on the upper face 3a of the optical functional element 3 can still be exposed. As a result, the functional element-mounted module 1 can be further decreased in size.

Figure 4:
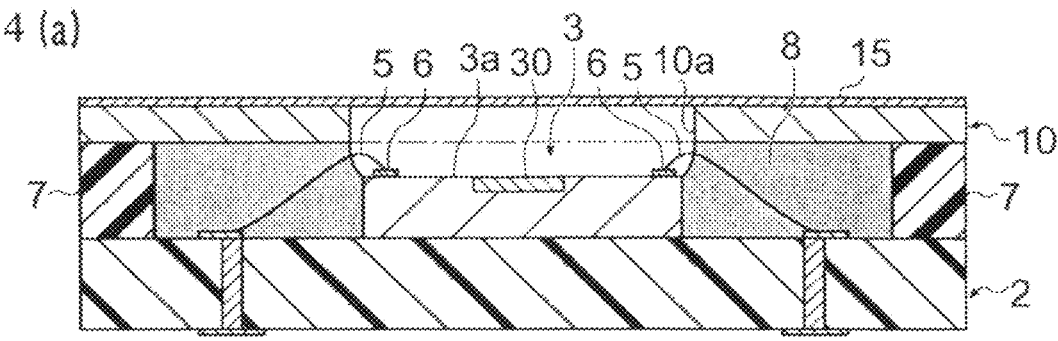
FIGS. 4(a) to (c) are sectional configuration views illustrating a principal portion of another embodiment of the present disclosure of a functional element-mounted module.
Figure 4:
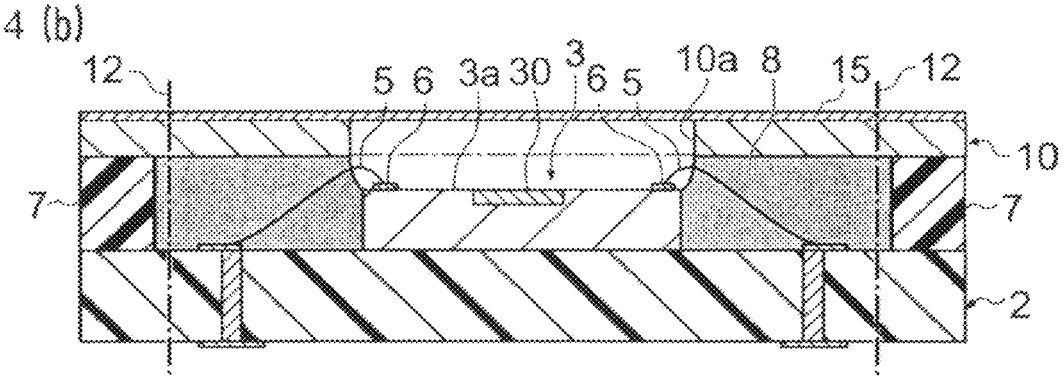
Figure 4:
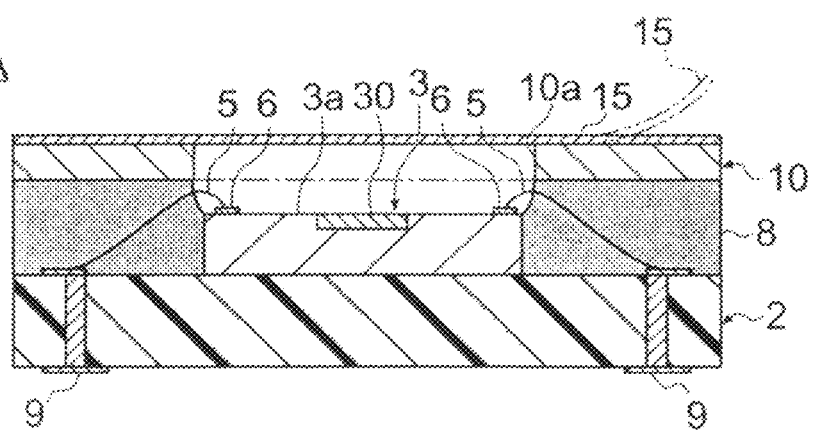

FIGS. 4(a) to (c) are sectional configuration views illustrating a principal portion of another embodiment of the present disclosure. In the following, description portions corresponding to those in the above-mentioned embodiment are given the same reference numerals in this embodiment, and their detailed explanation is omitted.

As shown in FIG. 4(a), a protecting film 15 made of a resinous material is bonded, with an adhesive, for example, onto a package-component member 10, which is fixed onto a substrate 2 by filling and curing a sealing resin 8 through the steps explained in connection with FIGS. 1(a) to (c) above so that the cover film may cover a hole 10a.

In this embodiment, the adhesive to be used for bonding the protecting film 15, is an adhesive having weak bonding force such that the protecting film 15 may be peeled from the package-component member 10.

As shown in FIGS. 4(b) and (c), dicing is performed along scribing lines 12 near the inner side of a bank 7 in the same manner as in the above embodiment, thereby obtaining a target functional element-mounted module 1A.

In addition to the same effects as the above embodiment, according to the present embodiment, since the protecting film 15 is provided on the package-component member 10 to cover the function part-exposing hole 10a, foreign matters can be prevented from attaching to an optical function part 30 of an optical functional element 3.

Furthermore, according to the present embodiment, since the protecting film 15 is peelable from the package-component member 10, optical signals can be inputted into and outputted from the optical function part 30 of the optical functional element 3 without attenuation by peeling the protecting film 15 in use (See FIG. 4(c)). Other constructions, functions and effects are the same as those in the above-mentioned embodiments, and as a result their detailed explanation is omitted.

FIGS. 5(a) to (c) are sectional configuration views illustrating a principal portion of a further embodiment of the present disclosure. In the following disclosure, portions corresponding to those in the above-mentioned embodiment are given the same reference numerals in this embodiment, and their detailed explanation is omitted.

As shown in FIG. 5(a), the present embodiment comprises a functional element 3A having a function part 30A such as a magnetic sensor or similar sensors, excluding an optical sensor, and a planar protecting cover member 16 bonded with an adhesive onto a package-component member 10, which is fixed onto a substrate 2 by filling and curing a sealing resin 8 by the steps explained in connection with FIGS. 1(a) to (c) of the above-mentioned embodiment, so that the cover member may cover a hole 10a.

As shown in FIGS. 5(b) and (c), a bank 7 is removed by dicing along scribing lines 12 near the inner side of the bank 7 in the same manner as the above-mentioned embodiments. Accordingly, a functional element-mounted module 1B of a completely sealed type hollow structure is obtained.

In addition to the same effects as the above-mentioned embodiments, according to the present embodiment, since the protecting cover member 16 is provided on the package-component member 10 to cover the hole 10A, foreign matters can be prevented from attaching to the optical function part 30A of the optical functional element 3A.

FIG. 6 is a sectional configuration view showing a variation of the embodiment shown in FIGS. 5(a) to (c). As shown in FIG. 6, this functional element-mounted module 1C is provided with a gas exhaust member 16 at the position where the protecting cover member 16 is opposed to a functional element 3A, for example. This gas exhaust member communicates with a space 32 above a function part 30A of the functional element 3A.

In this embodiment, the gas exhaust member 16a is preliminarily provided in the protecting cover member 16 by drilling or similar actions. The protecting cover member 16 is bonded onto the package-component member 10 in such a manner to cover the hole 10a as mentioned above, and then the target functional element-mounted module 1C is obtained by dicing as mentioned above.

In the present embodiment, although the diameter of the gas exhaust member 16a of the protecting cover member 16 is not particularly limited, the diameter of the gas exhaust member 16a is preferably 0.1 to 0.5 mm for the purpose of preventing the invasion of foreign matters. According to this embodiment of the present disclosure, the package-component member 10 can be pressed after the protecting cover member 16 is bonded.

As a result of the functional element-mounted module 1C of the present embodiment having such a construction, since the protecting cover member 16 is provided with the gas exhaust member 16a which communicates with the space 32 above the function part 30A of the functional element 3A, the package can be protected from being broken by an expansion of a gas or moisture in hollow portions, such as the space 32 inside the package during solder reflowing when mounting the package.

Since the remaining construction of the present embodiment, its functions and effects are the same as the above-mentioned embodiments, their detailed explanation is omitted.

Figure 7:
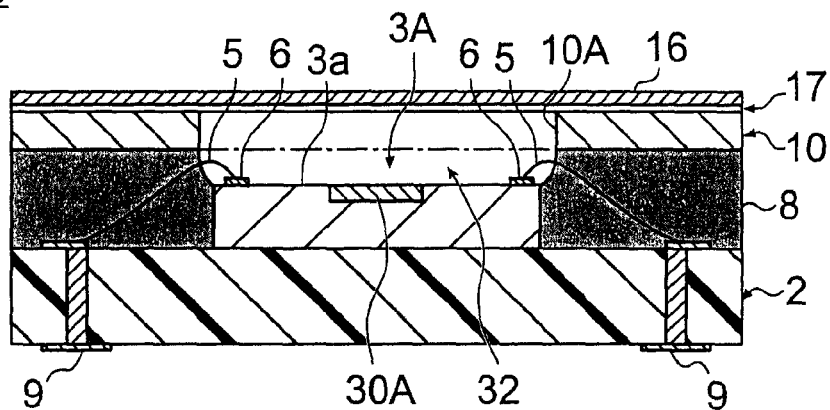
FIG. 7 is a sectional configuration view illustrating another variation of the embodiment in FIGS. 5(a) to (c) according to one aspect of the present disclosure.
Figure 8:
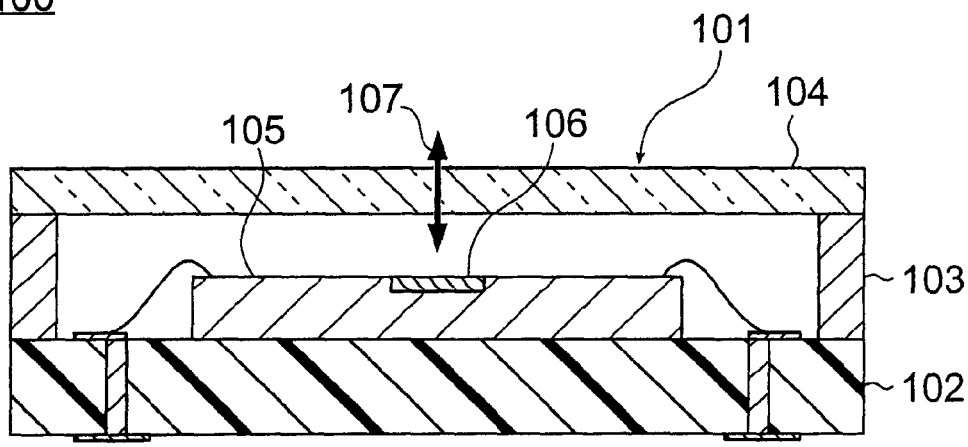
FIG. 8 is a sectional configuration view illustrating the conventional functional element-mounted module as known in the art.

FIG. 7 shows another example of the gas exhaust member provided in the protecting cover member of the embodiments shown in FIGS. 5(a) to (c). In the following disclosure, portions corresponding to those in the above-mentioned embodiment are given the same reference numerals as the embodiment, and their detailed explanation is omitted.

As shown in FIG. 7, according to a functional element-mounted module 1D of the present embodiment, a groove is formed at the position where a protecting cover member 16 is opposed to a package-component member 10, in a manner such that when the package-component member 10 is attached onto the protecting cover member 16, a gas exhaust member 17 is formed between them communicating with a space 32 above a function part 30A of a functional element 3A.

In this present embodiment, the groove is preliminarily provided in the protecting cover member 16, the protecting cover member 16 is bonded onto the package-component member 10 to cover the hole 10a as mentioned above, with the groove being opposed to the package component member 10, and the target functional element-mounted module 1D is obtained by dicing as mentioned above.

According to the constitution of the present embodiment, since the gas exhaust member 17 is provided between the package-component member 10 and the protecting cover member 16 to communicate with the space 32 above the function part 30A of the functional element 3A, the package can be prevented from being broken by expansion of a gas or moisture in hollow portions such as the space 32 inside the package during solder reflowing when mounting the package.

Since the remaining construction of the present embodiment, in functions and effects are the same as the above-mentioned embodiments, their detailed explanation is omitted.

The present disclosure is not limited to the above-mentioned embodiments, and various modifications can be made. For example, the bank may be formed in a ring-like shape in the above embodiments, or it also can be formed in a different shape, such as a plurality of protruding portions that are disposed at given intervals, so long as it effectively dams the liquid sealing resin.

Further, the present disclosure is not limited or restricted in its application to only the functional element-mounted modules using the optical functional element and the magnetic sensor, but also to components for use in various MEMS (Micro Electro Mechanical Systems).

What is claimed is:

1. A method for producing a functional element-mounted module, said method comprising:
   providing a substrate on which a functional element having a given function part and bonding pads therearound on a function part-side face of the element body is mounted by wire bonding, with the function part-side face upward;
   providing a bank to dam a liquid sealing resin near the functional element on the substrate, dropping the liquid sealing resin between the functional element and the bank, filling the liquid sealing resin between the functional element and the bank such that the bonding pads and partial wires for the wire bonding are exposed;
   abutting a package-component member having a hole formed through the package-component member and placed directly above the functional element to the bank such that the hole is opposed to the function part of the functional element, thereby bringing a lower face of the package-component member that is opposed to a top surface of the substrate into contact with the liquid sealing resin such that the bonding pads and the partial wires for the wire bonding remain exposed;
   providing a protective cover film peelable from the package-component member on the package-component member to cover the hole;
   fixing the package-component member onto the substrate by curing the liquid sealing resin that is in contact directly with both of the substrate and the package-component member; and
   cutting away the bank.

2. The method for producing the functional element-mounted module according to claim 1, wherein the hole of the package-component member is formed of almost the same size as the functional element.

3. The method for producing the functional element-mounted module according to claim 1, wherein a metallic film which enables wire bonding with gold and protects an Al-based electrode is provided on a bonding pad of the functional element.

* * * * *